United States Patent
Giesel et al.

(10) Patent No.: US 7,257,748 B2
(45) Date of Patent: Aug. 14, 2007

(54) METHOD FOR PROGRAMMING AND/OR TESTING FOR CORRECT FUNCTIONING OF AN ELECTRONIC CIRCUIT

(75) Inventors: Ruediger Giesel, Stuttgart (DE); Dieter Seifert, Bechhofen (DE); Rene Wolf, Schwieberdingen (DE); Ralf Henne, Sachsenheim (DE)

(73) Assignee: Robert Bosch GmbH, Stuttgart (DE)

( * ) Notice: Subject to any disclaimer, the term of this patent is extended or adjusted under 35 U.S.C. 154(b) by 653 days.

(21) Appl. No.: 10/357,658

(22) Filed: Feb. 3, 2003

(65) Prior Publication Data

US 2003/0217316 A1 Nov. 20, 2003

(30) Foreign Application Priority Data

Feb. 1, 2002 (DE) .............................. 102 04 125

(51) Int. Cl.
*G01R 31/28* (2006.01)

(52) U.S. Cl. ....................................... 714/724

(58) Field of Classification Search ................. 714/724
See application file for complete search history.

(56) References Cited

U.S. PATENT DOCUMENTS

| | | | |
|---|---|---|---|
| 5,173,904 A | 12/1992 | Daniels et al. | |
| 5,648,661 A * | 7/1997 | Rostoker et al. | 257/48 |
| 5,930,269 A * | 7/1999 | Tsukamoto et al. | 714/726 |
| 6,026,038 A | 2/2000 | Cho et al. | |
| 6,453,435 B1 * | 9/2002 | Limon et al. | 714/724 |
| 6,784,685 B2 * | 8/2004 | Chao et al. | 324/765 |
| 2002/0199142 A1 * | 12/2002 | Gefen | 714/724 |

* cited by examiner

*Primary Examiner*—Cynthia Britt
(74) *Attorney, Agent, or Firm*—Kenyon & Kenyon LLP

(57) ABSTRACT

Proposed is a method for programming and/or testing for the correct functioning of an electronic circuit, and a corresponding device, which is used to efficiently program and test electronic circuits combined on a wafer, prior to their separation. For this purpose, a bus allowing the individual electronic circuits to be sequentially tested is positioned on the wafer. Each electronic circuit is assigned an address for the bus, using a hardware code. The address is deactivated after completion of the functionality and testing method.

8 Claims, 1 Drawing Sheet

METHOD FOR PROGRAMMING AND/OR TESTING FOR CORRECT FUNCTIONING OF AN ELECTRONIC CIRCUIT

FIELD OF THE INVENTION

The present invention relates to a method for programming and/or testing the correct functioning of an electronic circuit.

SUMMARY OF THE INVENTION

The method of the present invention for programming and/or testing the correct functioning of an electronic circuit, and the corresponding device for implementing this method have the advantage that the idea of panel testing is implemented during the manufacturing of electronic circuits, and the cycle time during production is therefore reduced. A panel is generally understood to mean a large printed circuit board, which has several, substantially identical, electronic circuits, which are separated from each other after the programming and the functional testing. The method of the present invention and the device of the present invention allow electronic circuits connected in this manner to be programmed one after another and tested for correct functioning, by assigning them an address. The addressing of the specific electronic circuit is ultimately switched off, since it is no longer necessary for the further operation of electronic circuit. In this case, an electronic circuit is particularly understood to mean a control unit, but other programmable, electronic circuits, which may contain microprocessors, may be used here. The programming is accomplished by a connected device, which then also takes over the functional testing. The electrical connection between the electronic circuits allows this device to be connected. This electrical connection may advantageously take the form of the bus. However, individual lines may also lead to the individual electronic circuits of the panel.

It is particularly advantageous that, as mentioned above, the electronic circuits are arranged together on an electronic circuit board, the electrical connection between the electronic circuits and the electrical connection for attaching the test device being realized by a simple bus. A parallel bus is preferably used here. Therefore, the individual electronic circuits of the panel may be sequentially addressed as a function of the address.

In addition, it is advantageous that the address of the specific electronic circuit is reached, using an appropriate hardware code. This hardware code is situated in the electronic circuit, and in this case, it is preferably defined by a resistance code or parts of the test circuit. Short-circuiting links on the edge of the panel or binary codes are also conceivable alternatives to the resistance code. In the case of the binary codes, individual signals may be provided, in particular, on the panel edge at ground, while others are provided at the supply voltage.

Furthermore, it is advantageous that, in the event of an incorrect address determination, which, for example, is not able to be carried out because of a hardware fault, the electronic circuit assigns itself an address, which prevents the device from addressing it. This prevents a faulty circuit from blocking the communications bus and holding up production.

After the method is terminated, the address may advantageously be switched off by using a password, which the device retrieves, and which is checked by the individual electronic circuits.

Finally, is also advantageous that, in addition to the data connection via the bus, which may be used alternatively in addition to the power supply as well, the electronic circuits are connected to at least one power-supply line.

DETAILED DESCRIPTION

Figure 1:
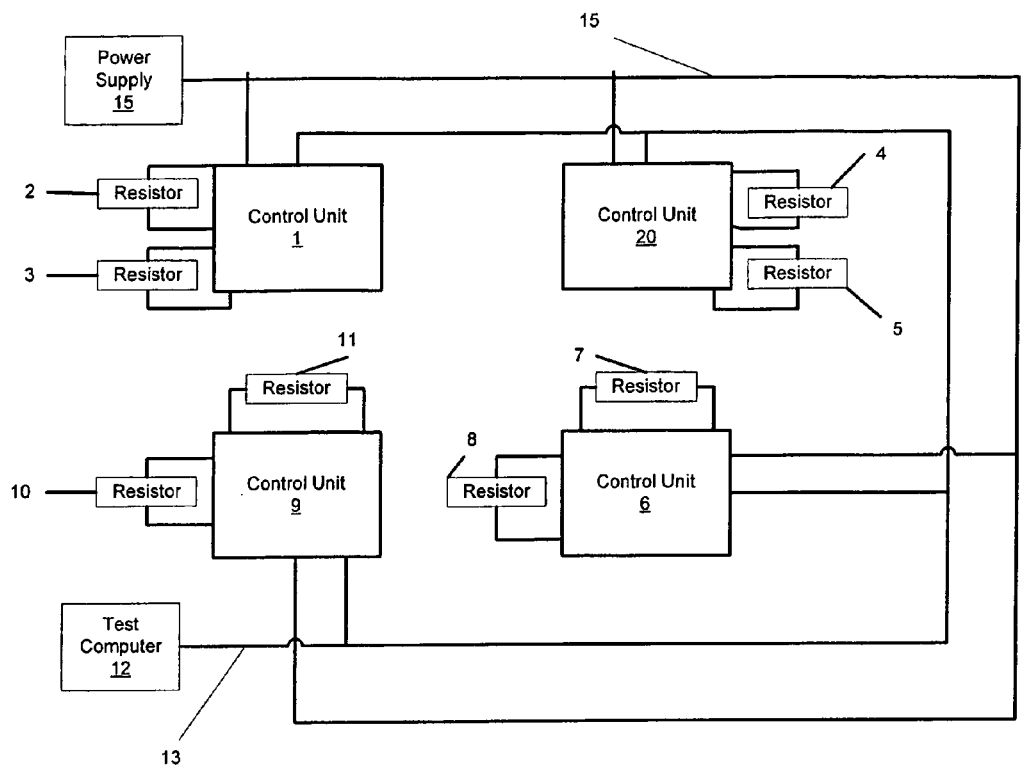
FIG. 1 shows a block diagram of the device according to the present invention.

The increasing use of control units necessitates the development of efficient production methods and start-up methods. The present invention proposes a method for programming and/or testing for the correct functioning of an electronic circuit, i.e. for example a control unit, which may be implemented on a panel, i.e. when several electronic circuits are situated on a common, printed circuit board. This is achieved by a bus, which is only attached to the printed circuit board for this reason. Instead of a bus, individual lines may also lead to the different electronic circuits, these individual lines also allowing the connection of a test device.

Therefore, such a printed circuit board panel is fitted with several control unit. These are powered via the panel edge, e.g. using a supply line and a ground line, and are connected to a test computer, i.e. the device, by a so-called K-line bus. To test the panel on the K-line bus, it is imperative that each control unit have a unique K-line address. In order for it to be able to assign each control unit a separate address, each control unit has an individual hardware testing circuit on the panel edge, by which it may determine its address. When the control units are separated from the panel, this test circuit may subsequently be separated out with the waste material. The address determination, which is achieved by supplying electrical energy via the supply line, starts immediately after the control units are switched on.

The test circuit for determining the address is situated on the panel edge and is made up of two resistors per control unit. After the control unit is switched on, the control unit checks at which inputs there are test resistances in the expected resistance range. Each control unit determines its address, based on the position of the detected test resistances. To determine an address, it is ascertained that just exactly two resistors are present and a valid combination of resistor positions is present. If the address cannot be determined unequivocally, e.g. due to a hardware error, then the control unit assigns itself address 00. Consequently, it is no longer addressed in later tests and may not interfere with the K-line bus.

In addition, a fuse, which keeps a short-circuit of an individual control unit from preventing the testing of the entire panel, is built into the supply line of each control unit. The addressing of the panel may be switched off by writing a password into the memory. In this case, an EEPROM is used as a memory. This is done as the last testing step prior to sectioning the panel. If a bus is used, then the connected, electronic circuits have a bus driver, in order to be able to communicate via the bus. In other words, they have transmitting-receiving units, i.e. transmitter-receiver chips. In the case of individual lines that lead to the test apparatus, the control units also have transmitting-receiving units, in order to be able to communicate via the line. Even the test device has such units of communication.

FIG. 1 shows a block diagram of the device according to the present invention. Represented is a panel on which control units 1, 6, 9, and 20 are situated. Control unit 1 has two attached resistors 2 and 3, control unit 20 has resistors 4 and 5, control unit 6 has resistors 7 and 8, and control unit 9 has resistors 10 and 11. These resistors determine the address of each individual control unit. Using a bus 13, which is designed here to be a parallel bus, the control units are connected as bus stations to a device 12 that functions as a test computer. In addition, control units 1, 6, 9, and 20 are connected by a power-supply line 15 to a power supply 14. It is also possible for control units 1, 6, 9, and 20 to be supplied with power by bus 13, so that a power-line transmission is then used in this case.

Figure 2:
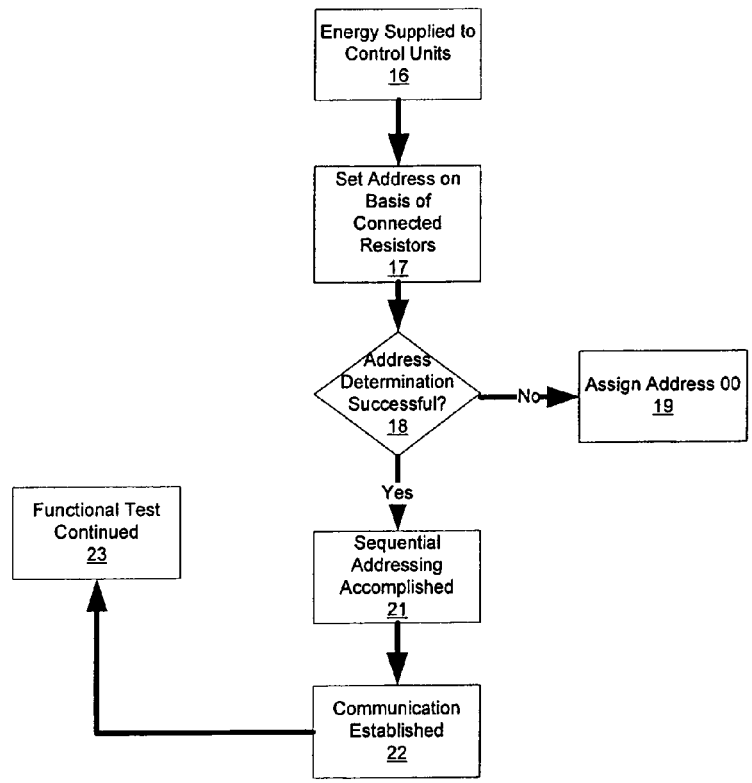
FIG. 2 shows a flow chart of the method according to the present invention.

FIG. 2 shows a flow chart of the method according to the present invention. In method step 16, electrical energy is supplied to control units 1, 6, 9, and 20 by power supply 14, via line 15. As mentioned above, it is alternatively possible to supply power to control units 1, 6, 9, and 20 via bus 13. In this case, test computer 12 then functions as a master. It is alternatively possible to use a multi-master system, as is known from the CAN bus. In a master-slave system, as is used in this case, individual control units 1, 6, 9, and 20 are subordinated to test computer 12 as slaves. After electrical power is supplied, each control unit 1, 6, 9, and 20 sets its address on the basis of the connected resistors, as shown in method 17. If this address determination is successful, i.e. if the detected resistance values are in the expected range, then the method goes on to method step 21. But if it is established in method step 18, that this address could not be correctly determined, then the control unit in question assigns itself the address 00 in method step 19, which causes this control unit not to be addressed by test computer 12 during the programming and the functional test.

In method step 21, the sequential addressing is then accomplished as a function of the address of the individual control unit, using test computer 12. In this context, the individual control units are programmed in their memory. At the beginning, all of control units 1, 6, 9, and 20 had the same memory state, and no parameters were programmed. After the addressing is carried out by the individual control units, a control character is transmitted on the bus by, namely, test computer 12, so that only the control unit, whose address corresponds to this control character, reacts to it. If the corresponding control unit is activated, then, in method step 22, communication is established, using a normal factory airbag diagnosis, and a set of parameters is programmed into the control unit. At the end of the programming, a further control character is transmitted, which is the same for all of the units, so that the communication is ended by ending the factory-diagnosis mode, as well. A further control character is then transmitted, which activates the corresponding control unit, and the same operation is repeated until the entire panel is processed. After the programming, the functional test may be continued in order to finally conclude with the method and switch off the address in method step 23. The disconnection is accomplished by writing a password into the memory, after which the panel is then sectioned. A further refinement may provide for a fuse being installed in the supply line of each electronic circuit, the fuse keeping a short-circuit of an individual electronic circuit from preventing the testing of the entire panel.

What is claimed is:

1. A method for performing at least one of a programming and a testing for correct functioning of a first electronic circuit of a plurality of electronic circuits that are joined by an electrical interconnection, the method comprising:
   assigning each electronic circuit a specific address, wherein in at least the first electronic circuit, producing the specific address by a specific hardware code in the first electrornc circuit;
   addressing each electronic circuit by a connected device according to the specific address thereof, after electrical energy is supplied to the plurality of electronic circuits, in order to at least one of program and test the first electronic circuit for correct functioning; and
   switching off the specific address of the first electronic circuit after at least one of the programming and the testing is completed, wherein the specific address is switched off by using a password.

2. The method as recited in claim 1, wherein:
   the plurality of electronic circuits is situated on a common, printed circuit board, and
   the electrical interconnection is accomplished by a bus.

3. The method as recited in claim 1, further comprising:
   if an incorrect address determination occurs, causing the first electronic circuit to assign thereto an address that prevents access by the connected device.

4. A device for performing at least one of a programming and a testing for correct functioning of a plurality of electronic circuits that are joined by an electrical interconnection, comprising:
   a device for performing, through the electrical interconnection, at least one of the programming and the testing for correct functioning of the electronic circuits, each electronic circuit having a specific address for communication with the device, wherein in at least the first electronic circuit, the specific address is produced by a specific hardware code in the first electronic circuit, the device configured to switch off the specific address after the programming is completed wherein the specific address is switched off by using a password.

5. The device as recited in claim 4, wherein:
   the electronic circuits are combined on a common wafer to form a panel.

6. The device as recited in claim 4, wherein:
   the specific address is set using resistance coding.

7. The device as recited in claim 4, wherein:
   the electrical interconnection is produced by a bus.

8. The device as recited in claim 7, wherein:
   the electronic circuits are connected to at least one power-supply line by the bus.

* * * * *